United States Patent
Tsai et al.

(10) Patent No.: US 7,008,729 B2
(45) Date of Patent: Mar. 7, 2006

(54) METHOD FOR FABRICATING PHASE MASK OF PHOTOLITHOGRAPHY PROCESS

(75) Inventors: Kao-Tsair Tsai, Hsin-Chu (TW);
Chii-Ming Shiah, Hsin-Chu (TW);
Yu-Cheng Tung, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 63 days.

(21) Appl. No.: 10/274,896

(22) Filed: Oct. 22, 2002

(65) Prior Publication Data

US 2004/0076890 A1    Apr. 22, 2004

(51) Int. Cl.
*G03F 9/00* (2006.01)
*G03C 5/00* (2006.01)

(52) U.S. Cl. .......................................... 430/5; 430/323
(58) Field of Classification Search .................. 430/5, 430/323

See application file for complete search history.

(56) References Cited

U.S. PATENT DOCUMENTS 5,403,682 A * 4/1995 Lin .............................. 430/5

5,503,951 A * 4/1996 Flanders et al. ............... 430/5

\* cited by examiner

*Primary Examiner*—Saleha R. Mohamedulla
(74) *Attorney, Agent, or Firm*—Rosenberg, Klein & Lee

(57) ABSTRACT

First of all, a substrate applied in the lithography process is provided, and then a high transmission attenuate layer (HTAL) is formed on the substrate. Then an opaque layer is formed on the high transmission attenuate layer (HTAL), and then an ion-implanting process is performed in the high transmission attenuate layer (HTAL). Afterward, the opaque layer is etched to define a first phase region and a second phase region on the high transmission attenuate layer (HTAL). Subsequently, a photoresist layer is formed on the second phase region and the opaque layer to expose a partial surface of the high transmission attenuate layer (HTAL) that is located the first phase region. Then the partial surface of the high transmission attenuate layer (HTAL) that is located on the first phase region is etched through until a predetermined depth in the substrate. Finally, removing the photoresist layer is to form a phase shifted region in the etched region and a phase unshifted region in the unetched region, whereby a phase mask that can make uniform exposure intensity is obtained by this invention.

19 Claims, 3 Drawing Sheets

METHOD FOR FABRICATING PHASE MASK OF PHOTOLITHOGRAPHY PROCESS

BACKGROUND OF THE INVENTION

1. Field of the Invention

The present invention relates generally to a method for forming the phase shift mask of photolithography process, and more particularly to a method for fabricating alternating phase shift mask of photolithography process with ion-implanted layer.

2. Description of the Prior Art

As semiconductor devices, such as the Metal-Oxide-Semiconductor device, become highly integrated the area occupied by the device shrinks, as well as the design rule. With advances in the semiconductor technology, the dimensions of the integrated circuit (IC) devices have shrunk to the deep sub-micron range. As the semiconductor device continuously shrinks in the deep sub-micron region, some problems described below are incurred due to the scaling down process. In order to build very small electrically active devices on the wafer, the impact of these operations has to be confined to small, well-defined regions.

Lithography in the context of VLSI manufacturing of CMOS devices is the process of patterning openings in photosensitive polymers (sometimes referred to as photoresists or resists) which define small areas in which the silicon base (or other) material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence. The basic lithography system consists of a light source, a stencil or photomask containing the pattern to be transferred to the wafer, a collection of lenses, and a means for aligning existing patterns on the wafer with patterns on the mask. A lithography stepper is limited by parameters described in Rayleigh's equation:

$$R = k1 * \lambda / NA$$

Wherein, $\lambda$ is the wavelength of the light source used in the projection system and NA is the numerical aperture of the projection optics used. k1 is a factor describing how well a combined lithography system can utilize the theoretical resolution limit in practice and can range from 0.8 down to 0.5 for standard exposure systems. The highest resolution in optical lithography is currently achieved with deep ultra violet (DUV) steppers operating at 248 nm wavelength. Steppers operating at a wavelength of 356 nm are also in widespread use.

Conventional photomask consist of chromium patterns on a quartz plate, allowing light to pass wherever the chromium is removed from the mask. Light of a specific wavelength is projected through a mask onto the photoresist coated wafer, exposing the resist wherever hole patterns are placed on the mask. Exposing the resist to light of appropriate wavelength causes modifications in the molecular structure of the resist polymers which allows a developer chemical to dissolve and remove the resist in the exposed areas. (Conversely, negative resist systems allow only unexposed resist to be developed away.) The photomask, when illuminated, can be pictured as an array of individual, infinitely small light sources which can be either turned on (points covered by clear areas) or turned off (points covered by chrome). These conventional photomasks are commonly referred to as chrome on glass (COG) binary masks. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to $\lambda/NA$ (NA being the numerical aperture of the exposure system), electric field vectors of nearby images will interact and add constructively. The resulting light intensity curve between features is not completely dark, but exhibits significant amounts of light intensity created by the interaction of adjacent features. The resolution of an exposure system is limited by the contrast of the projected light image, which is the intensity difference between adjacent light and dark features. An increase in the light intensity in nominally dark regions will eventually cause adjacent features to print as one combined structure rather than discrete images.

The quality with which small images can be replicated in lithography depends largely on the available process latitude, that is, the amount of allowable dose and focus variation that still results in correct image size. As design feature are rapid shrinking, all of the lithography resolution enhancement techniques (RET), in principle, the use of Alternating Phase Mask (Strong Phase Shifted Mask) is the most effective method for it provides a nearly doubled resolution enhancement of patterning. Phase shifted mask (PSM) lithography improves the lithographic process latitude or allows operation of a lower k.sub. 1 value (see equation 1) by introducing a third parameter on the mask. The electric field vector, like any vector quantity, has a magnitude and direction, so in addition to turning the electric field amplitude on and off, the phase of the vector can changed. This phase variation is achieved in PSM's by modifying the length that a light beam travels through the mask material. By recessing the mask by the appropriate depth, light traversing the thinner portion of the mask and light traversing the thicker portion of the mask will be $\pi$ out of phase; that is, their electric field vectors will be of equal magnitude but point in exactly opposite directions so that any interaction between these light beams results in perfect cancellation.

The conventional mask is made of quartz with an image in chrome. This is referred to as a "chrome on glass" or binary mask. The minimum dimensions of circuits formed by photolithographic processes generally decrease as improvements in semiconductor manufacturing processes occur. Improving photolithography technology provides improved resolution, resulting in a potential reduction of the minimum dimensions of and spaces between electromagnetic radiation application regions where electromagnetic radiation is applied through the mask. However, conventional phase mask is difficult to be fabricated for forming the uniform intensity of exposure light. Except the difficulty of mask manufacturing, the most problem is the aerial intensity imbalance between the shift and unshifted region. It is because the exposure light was affected by scattering effect of mask topography, and then the diffraction light will results in different transmission intensity on wafer.

In accordance with the above description, a new and improved method for forming the phase mask is therefore necessary, so as to raise the yield and quality of the follow-up process.

SUMMARY OF THE INVENTION

In accordance with the present invention, a method is provided that substantially overcomes the drawbacks of the above mentioned problems when forming the poly-gate by using existing conventional methods.

Accordingly, it is one object of the present invention to provide an etching process for forming the phase mask. This invention can reduce the exposure intensity passed through unshifted region by forming a high transmission attenuated layer (HTAL) with an ion-implanting process, whereby both the exposure intensities in the unshifted region and the shifted region are the same. Accordingly, the present invention can efficaciously raise the quality in the process. Therefore, this invention can reduce the costs of the conventional process and hence correspond to economic effect, so that the present invention is appropriate for deep sub-micron technology when providing semiconductor devices.

In accordance with the present invention, a new method for forming the phase mask of the lithography process is disclosed. First of all, a substrate applied in the lithography process is provided, and then a high transmission attenuate layer (HTAL) is formed on the substrate. Then an opaque layer is formed on the high transmission attenuate layer (HTAL), and then an ion-implanting process is performed in the high transmission attenuate layer (HTAL). Afterward, the opaque layer is etched to define a first phase region and a second phase region on the high transmission attenuate layer (HTAL). Subsequently, a photoresist layer is formed on the second phase region and the opaque layer to expose a partial surface of the high transmission attenuate layer (HTAL) that is located the first phase region. Then the partial surface of the high transmission attenuate layer (HTAL) that is located on the first phase region is etched through until a predetermined depth in the substrate. Finally, removing the photoresist layer is to form a phase shifted region in the etched region and a phase unshifted region in the unetched region, whereby a phase mask that can make uniform exposure intensity is obtained by this invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

These preferred embodiments of the present invention are now described in greater detail. Nevertheless, it should be recognized that the present invention can be practiced in a wide range of other embodiments besides those explicitly described, and the scope of the present invention is expressly not limited except as specified in the accompanying claims.

Figure 1A:
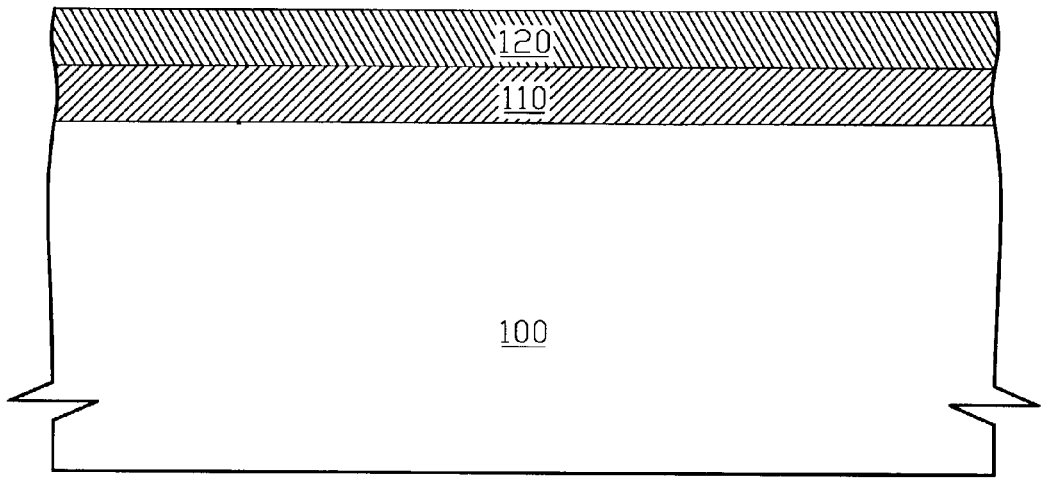
FIG. 1A to FIG. 1E show cross-sectional views illustrative of various stages for forming the phase mask of the photolithography process in accordance with the second embodiment of the present invention.
Figure 1B:
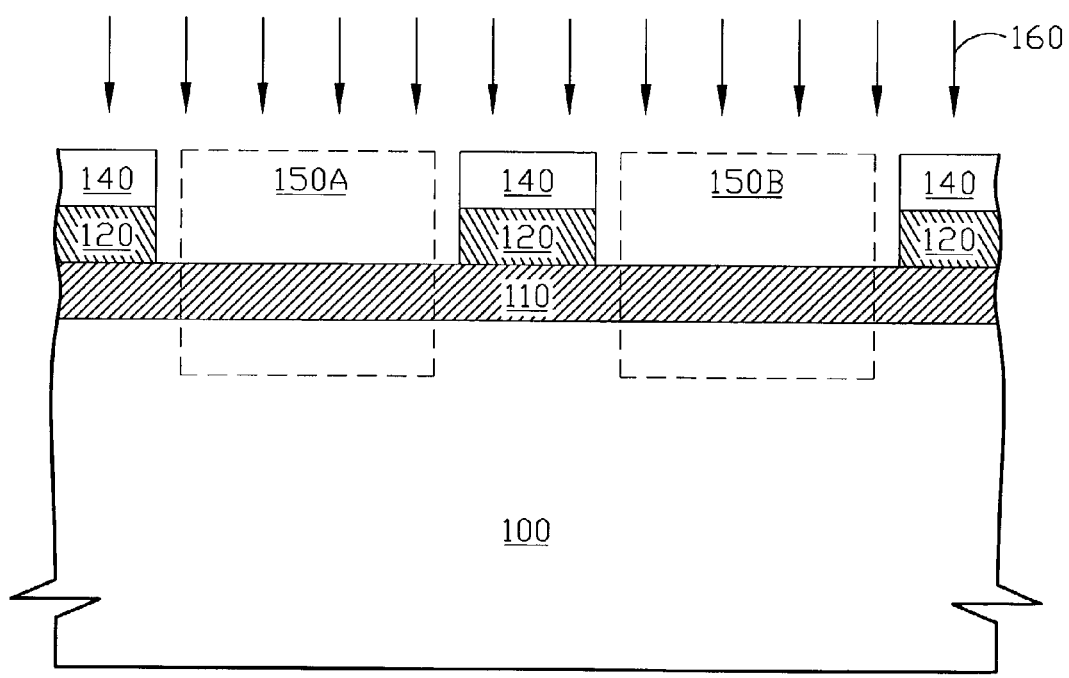

As illustrated in FIG. 1A, in one embodiment of the present invention, a substrate 100 for photolithography process is provided, wherein the material of the substrate 100 comprises a pervious material, such as a quartz material. Then a high transmission attenuate layer (HTAL) 110 is formed on the substrate 100, and the method for forming the high transmission attenuate layer (HTAL) 110 comprises a depositing process, such as a chemical vapor deposition (CVD), and the material of the high transmission attenuate layer (HTAL) 110 comprises a high transmission phase shifter material, such as a $Ta_\alpha Si_\beta O_x$, wherein the high transmission phase shifter material can be adjusted it's transmission by changing it's component percentage. Next, an opaque layer 120 is formed on the high transmission attenuate layer (HTAL) 110, wherein the opaque layer 120 comprises a Cr layer (Chromium) Afterward, an ion-implanting process 130 is performed to dope the high transmission attenuate layer (HTAL) 110, wherein ion-implanting process 130 is a blanket ion-implanting process, as shown in FIG. 1B.

Figure 1C:
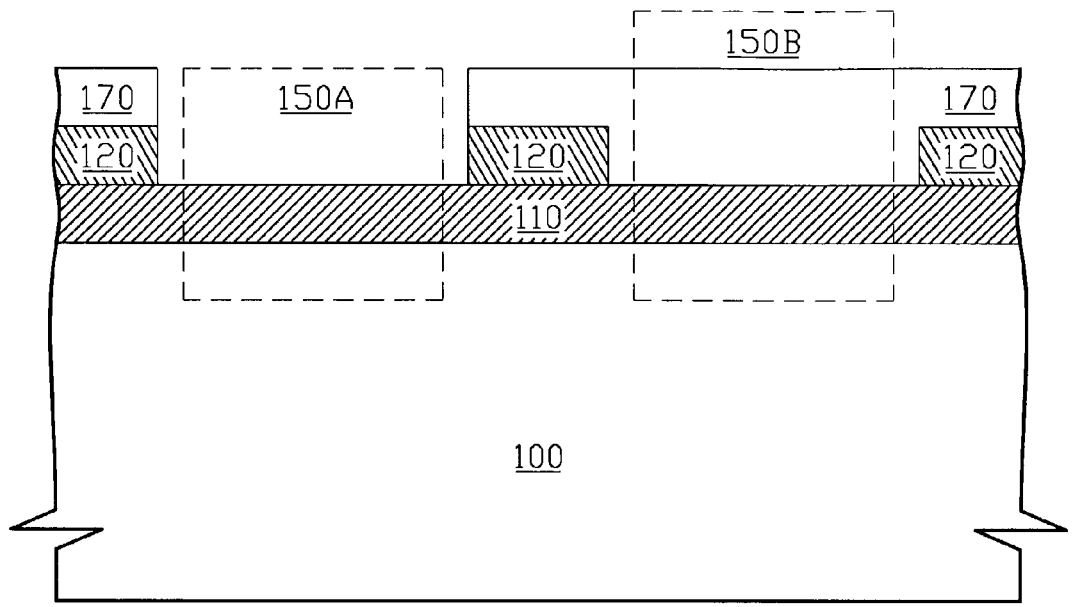

Referring to FIG. 1C, in this embodiment, a first photoresist layer 140 is formed on the opaque layer 120 to define a first phase region 150A and a second phase region 150B. Then a first etching process is performed by the first photoresist layer 140 as an etched mask to etch the opaque layer 120, so as to form the first phase region 150A and the second phase region 150B on the high transmission attenuate layer (HTAL) 110, wherein the first etching process comprises a dry etching process. After removing the first photoresist layer 140, a second photoresist layer 170 is formed on the second phase region 150B and the opaque layer 120 to expose a partial surface of the high transmission attenuate layer (HTAL) 110 that is located on the first phase region 150A, as shown in FIG. 1C.

Figure 1D:
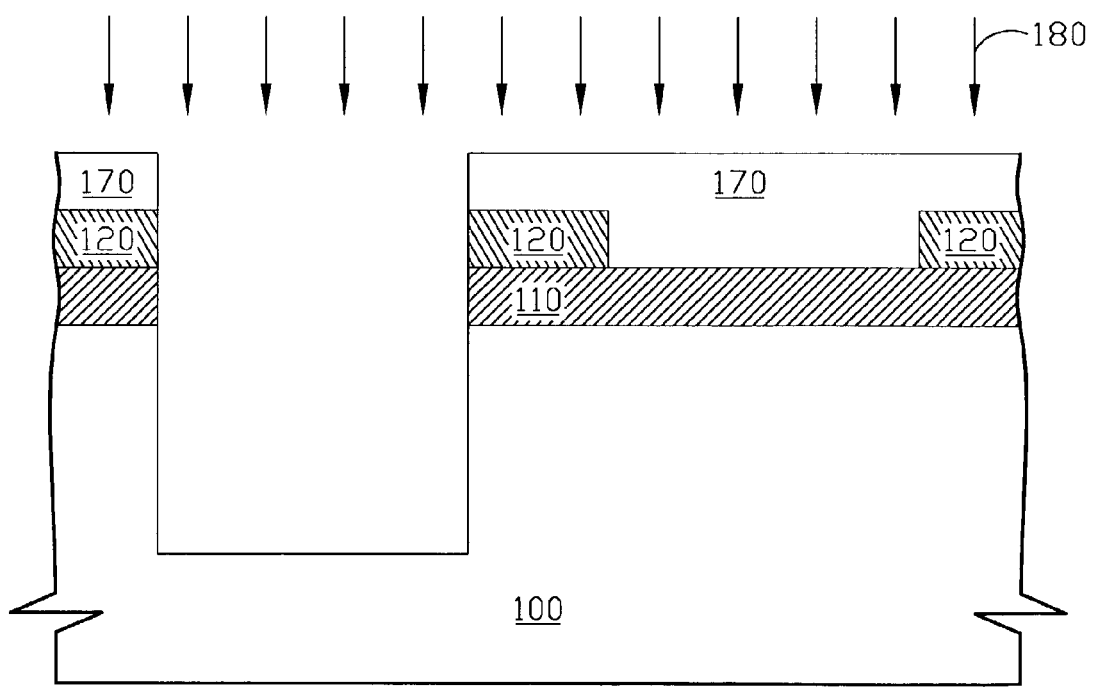
Figure 1E:
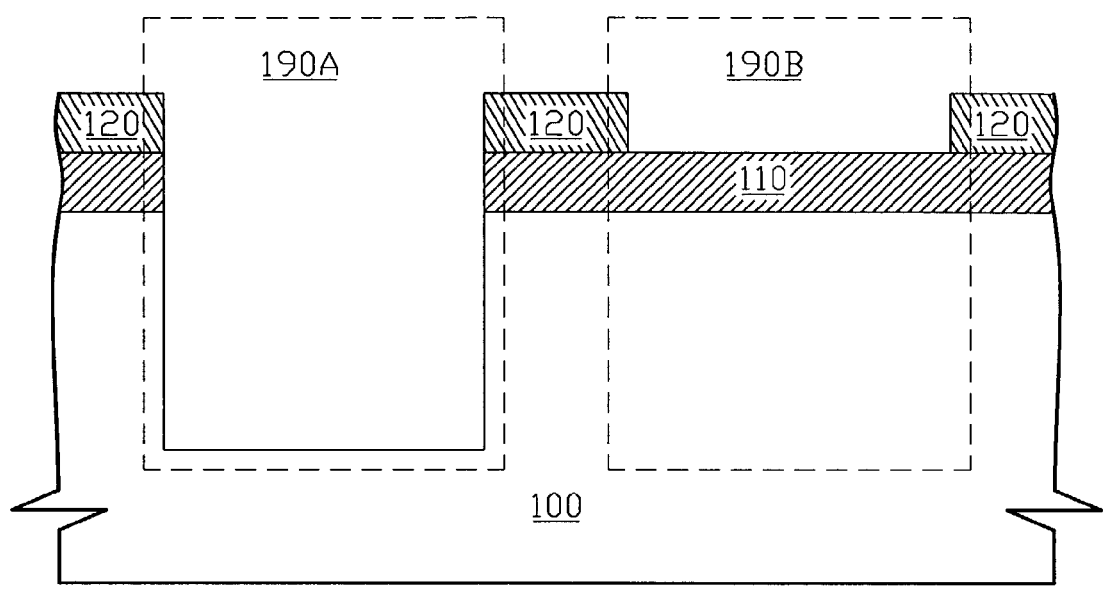

Referring to FIG. 1D, in this embodiment, a second etching process 180 is performed by the second photoresist layer 170 as an etched mask to etch through the partial surface of the high transmission attenuate layer (HTAL) 110 that is located on the first phase region 150A until a predetermined phase depth D within the substrate 100 is reached, wherein the phase depth must fit the equation as follow:

$$D=(\Phi/2\pi)\times[\lambda/(n-1)]$$

Wherein $\Phi$ is phase, $\lambda$ is the exposure wave length and n is the material index of refraction; furthermore, the second etching process 180 comprises a dry etching process. Finally, removing the second photoresist layer 170 is to form a phase shifted region 190A, such as 180° phase, in the first phase region 150A and a phase unshifted region 190B, such as 0° phase, in the second phase region, whereby a phase mask that can make uniform exposure intensity is obtained by this invention, as shown in FIG. 1E.

In this embodiment of the present invention, as discussed above, this invention can provide a method for forming the strong phase shifted mask. In this invention, it is introduced that an high transmission phase shifter material on unshifted region as an attenuated intermediate layer. So when the exposure light pass through the unshifted region, its intensity will be attenuated to the same intensity with shifted region, whereby both the exposure intensities in the unshifted region and the shifted region are the same. Accordingly, the present invention can efficaciously raise the quality in the process. Therefore, this invention can reduce the costs of the conventional process and hence correspond to economic effect, so that the present invention is appropriate for deep sub-micron technology when providing semiconductor devices. Therefore, the present invention is appropriate for deep sub-micron technology in providing semiconductor devices.

Of course, it is possible to apply the present invention to the photolithography process, and it is also possible for the present invention to be applied to any semiconductor process. Furthermore, at the present time, forming a high transmission attenuate layer (HTAL) and performing an ion-implanting process of the present invention can be applied to form the phase mask concerning lithography process.

Although the specific embodiments have been illustrated and described, it will be obvious to those skilled in the art that various modifications may be made without departing from what is intended to be limited solely by the appended claims.

Obviously, many modifications and variations of the present invention are possible in light of the above teachings. It is to be understood that within the scope of the appended claims, the present invention may be practiced other than as specifically described herein.

What is claimed is:

1. A method for forming a phase shifted device of the photolithography process, the method comprising:
   providing a semiconductor substrate;
   forming a transmission attenuate layer on said semiconductor substrate;
   forming an opaque layer on said transmission attenuate layer;
   doping said transmission attenuate layer;
   etching a portion of said opaque layer to form a first phase region and a second phase region on said transmission attenuate layer; and
   etching through the partial surface of said transmission attenuate layer that is located on said first phase region until a predetermined depth within said semiconductor substrate, so as to form a phase shifted region in said first phase region and a phase unshifted region in said second phase region.

2. The method according to claim 1, wherein the material of said semiconductor substrate comprises a pervious material.

3. The method according to claim 2, wherein said pervious material comprises a quartz.

4. The method according to claim 1, wherein the material of said transmission attenuate layer comprises a high transmission phase shifter material.

5. The method according to claim 4, wherein said high transmission phase shifter material comprises a material of TaαSiβOx.

6. The method according to claim 1, wherein the method for forming said transmission attenuate layer comprises a depositing process.

7. The method according to claim 6, wherein said depositing process comprises a chemical vapor deposition.

8. The method according to claim 1, wherein said opaque layer comprises a Cr layer.

9. The method according to claim 1, wherein the method for doping said transmission attenuate layer comprises a blanket ion-implanting process.

10. The method according to claim 1, wherein said predetermined depth is depended on an equation as follow:

$$D=(\Phi/2\pi)\times[\lambda/(n-1)]$$

Wherein $\Phi$ is phase, $\lambda$ is the exposure wave length and n is the material constant.

11. A method for forming a phase mask of the photolithography process, the method comprising:
   providing a pervious substrate;
   depositing a high transmission attenuate layer on said pervious substrate;
   forming an opaque layer on said high transmission attenuate layer;
   performing an ion-implanting process to dope said high transmission attenuate layer;
   etching said opaque layer to form a first phase region and a second phase region on said high transmission attenuate layer;
   forming a photoresist layer on said second phase region and said opaque layer to expose a partial surface of said high transmission attenuate layer that is located on said first phase region;
   performing an etching process by said photoresist layer as an etched mask to etch through the partial surface of said high transmission attenuate layer that is located on said first phase region until a phase depth within said pervious substrate; and
   removing said photoresist layer to form a phase shifted region in said first phase region and a phase unshifted region in said second phase region.

12. The method according to claim 11, wherein said high transmission attenuate layer comprises a material of TaαSiβOx.

13. The method according to claim 11, wherein said opaque layer comprises a chromium layer.

14. The method according to claim 11, wherein said etching process comprises a dry etching process.

15. The method according to claim 11, wherein said phase depth is depended on an equation as follow:

$$D=(\Phi/2\pi)\times[\lambda/(n-1)]$$

Wherein $\Phi$ is phase, $\lambda$ is the exposure wave length and n is the material constant.

16. The method according to claim 11, wherein said phase shifted region is 1800 phase.

17. The method according to claim 11, wherein said phase unshifted region is 00 phase.

18. A method for forming a phase shifted mask of the photolithography process, the method comprising:
   providing a quartz substrate;
   forming a TaαSiβOx layer on said quartz substrate by a chemical vapor deposition process;
   forming a Chromium layer on said TaαSiβOx layer;
   performing a blanket ion-implanting process to dope said TaαSiβOx layer;
   forming a first photoresist layer on Chromium layer to define a first phase region and a second phase region;
   performing a first dry etching process by said first photoresist layer as an etched mask to etch Chromium layer, so as to form said first phase region and said second phase region on said TaαSiβOx layer;
   removing said first photoresist layer;
   forming and defining a second photoresist layer on said second phase region and said Chromium layer to expose a partial surface of said TaαSiβOx layer that is located on said first phase region;
   performing a second dry etching process by said second photoresist layer as an etched mask to etch through the partial surface of said TaαSiβOx layer that is located on said first phase region until a phase depth within said quartz substrate; and
   removing said second photoresist layer to form a phase shifted region with 1800 in said first phase region and a phase unshifted region with 00 in said second phase region.

19. The method according to claim 18, wherein said phase depth is depended on an equation as follow:

$$D=(\Phi/2\pi)\times[\lambda/(n-1)]$$

Wherein $\Phi$ is phase, $\lambda$ is the exposure wave length and n is the material constant.

* * * * *